(12) United States Patent
Schwarz et al.

(10) Patent No.: US 11,276,803 B2
(45) Date of Patent: Mar. 15, 2022

(54) OPTOELECTRONIC SEMICONDUCTOR DEVICE HAVING A SIDE FACE AS MOUNTING SIDE

(71) Applicant: OSRAM OLED GmbH, Regensburg (DE)

(72) Inventors: Thomas Schwarz, Regensburg (DE); Frank Singer, Regenstauf (DE)

(73) Assignee: OSRAM OLED GMBH, Regensburg (DE)

( * ) Notice: Subject to any disclaimer, the term of this patent is extended or adjusted under 35 U.S.C. 154(b) by 648 days.

(21) Appl. No.: 15/534,155

(22) PCT Filed: Dec. 4, 2015

(86) PCT No.: PCT/EP2015/078708
§ 371 (c)(1),
(2) Date: Jun. 8, 2017

(87) PCT Pub. No.: WO2016/091759
PCT Pub. Date: Jun. 16, 2016

(65) Prior Publication Data
US 2017/0338384 A1    Nov. 23, 2017

(30) Foreign Application Priority Data

Dec. 10, 2014  (DE) .................. 10 2014 118 349

(51) Int. Cl.
*H01L 33/54* (2010.01)
*H01L 33/48* (2010.01)
(Continued)

(52) U.S. Cl.
CPC ............ *H01L 33/486* (2013.01); *H01L 24/95* (2013.01); *H01L 33/0093* (2020.05);
(Continued)

(58) Field of Classification Search
CPC ..... H01L 33/0079; H01L 33/54; H01L 33/60; H01L 33/62; H01L 33/486; H01L 24/95
See application file for complete search history.

(56) References Cited

U.S. PATENT DOCUMENTS 8,535,961 B1 * 9/2013 Kuo .................. H01L 24/24
                                                438/28
8,723,192 B2   5/2014 Weidner et al.
(Continued)

FOREIGN PATENT DOCUMENTS

| DE | 102005007601 A1 | 9/2005 |
| DE | 102009036621 A1 | 2/2011 |
| WO | 2014016164 A1 | 1/2014 |
| WO | 2014154632 A1 | 10/2014 |

*Primary Examiner* — Richard A Booth
(74) *Attorney, Agent, or Firm* — Slater Matsil, LLP

(57) ABSTRACT

In an embodiment an optoelectronic semiconductor device includes a semiconductor chip having a semiconductor layer sequence with an active region, a radiation exit surface arranged parallel to the active region and a plurality of side faces arranged obliquely or perpendicular to the radiation exit surface. The device further includes a contact track electrically connecting the semiconductor chip to a contact surface configured to externally contact the semiconductor device, a molding and a rear side of the semiconductor chip remote from the radiation exit surface, the rear side being free of a material of the molding, wherein one of the side faces is configured as a mounting side face for fastening of the semiconductor device, and wherein the contact track partially runs on one of the side faces.

16 Claims, 9 Drawing Sheets

(51) Int. Cl.
*H01L 33/62* (2010.01)
*H01L 33/00* (2010.01)
*H01L 23/00* (2006.01)
*H01L 33/60* (2010.01)
*H01L 21/56* (2006.01)

(52) U.S. Cl.
CPC .............. *H01L 33/54* (2013.01); *H01L 33/60* (2013.01); *H01L 33/62* (2013.01); *H01L 21/568* (2013.01); *H01L 2224/01* (2013.01); *H01L 2224/24* (2013.01); *H01L 2224/82* (2013.01); *H01L 2924/0002* (2013.01); *H01L 2924/181* (2013.01); *H01L 2933/005* (2013.01); *H01L 2933/0033* (2013.01)

(56) References Cited

U.S. PATENT DOCUMENTS

| | | |
|---|---|---|
| 8,835,937 B2 | 9/2014 | Wirth et al. |
| 9,373,766 B2 | 6/2016 | Sabathil et al. |
| 2008/0186733 A1 | 8/2008 | Ho et al. |
| 2009/0315068 A1* | 12/2009 | Oshio ............... H01L 33/62 257/103 |
| 2010/0025722 A1 | 2/2010 | Wada |
| 2010/0096653 A1 | 4/2010 | Kim et al. |
| 2010/0127294 A1 | 5/2010 | Chen et al. |
| 2010/0314658 A1 | 12/2010 | Yamamoto |
| 2012/0153340 A1 | 6/2012 | Song et al. |
| 2016/0056344 A1 | 2/2016 | Reill et al. |
| 2016/0225964 A1 | 8/2016 | Schwarz et al. |

\* cited by examiner

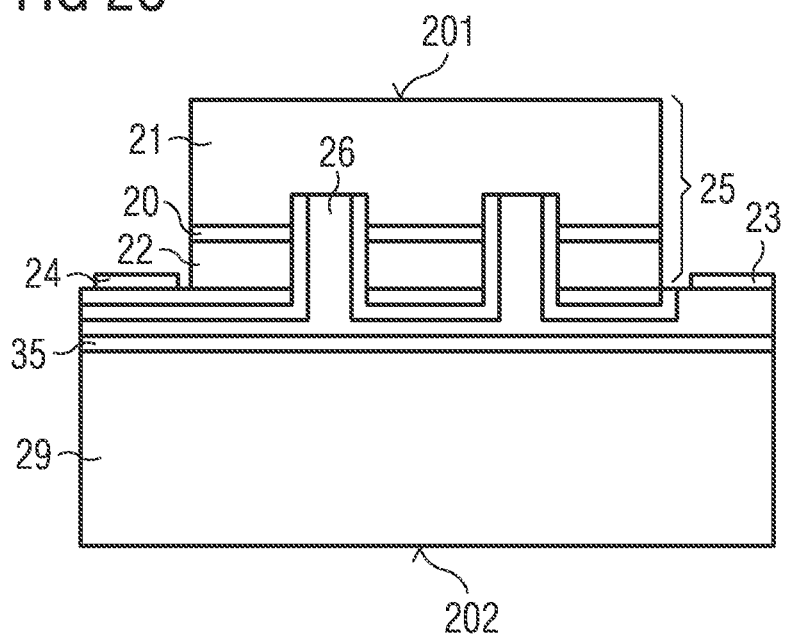
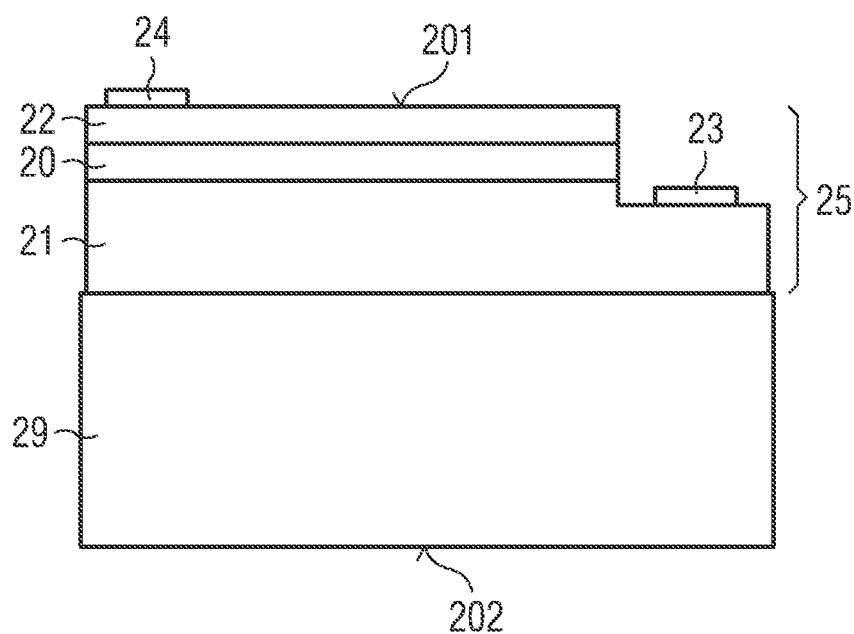

OPTOELECTRONIC SEMICONDUCTOR DEVICE HAVING A SIDE FACE AS MOUNTING SIDE

This patent application is a national phase filing under section 371 of PCT/EP2015/078708, filed Dec. 4, 2015, which claims the priority of German patent application 10 2014 118 349.5, filed Dec. 10, 2014, each of which is incorporated herein by reference in its entirety.

TECHNICAL FIELD

The present application relates to an optoelectronic semiconductor device and a method for producing a plurality of optoelectronic semiconductor devices.

BACKGROUND

In handheld electronic devices, such as mobile telephones, for example, liquid crystal displays are often used, which are backlit by light-emitting diodes (LEDs) radiating laterally into light guides. In a reduction in the weight and depth of such devices, the light guides and LEDs must also be miniaturized further. In addition, it must be possible to produce the LEDs inexpensively. These requirements cannot be achieved easily with conventional designs.

SUMMARY OF THE INVENTION

One object is to specify an optoelectronic semiconductor device, which is distinguished by a low mounting height and permits efficient production of a light current adequate for the use of the device. Furthermore, a method is to be specified with which such optoelectronic semiconductor devices can be produced simply and inexpensively.

These objects are achieved inter alia by an optoelectronic semiconductor device and a method according to the independent claims. Other configurations and utilities are the object of the dependent claims.

An optoelectronic semiconductor device according to at least one embodiment has a semiconductor chip. The semiconductor chip has an active region provided for generating radiation. For example, the active region is part of an in particular epitaxial semiconductor layer sequence. The active region is provided in particular for generating radiation in the visible, ultraviolet or infrared spectral range. The semiconductor layer sequence has, for example, a first semiconductor layer of a first conductor type and a second semiconductor layer of a second conductor type different from the first conductor type. The active region is arranged between the first semiconductor layer and the second semiconductor layer. For the electrical contacting of the semiconductor chip, the semiconductor chip expediently has a first contact and a second contact. In particular, the first contact is provided for electrical contacting of the first semiconductor layer and the second contact is provided for electrical contacting of the second semiconductor layer. The contacts can be formed respectively as sub-regions of the first semiconductor layer and the second semiconductor layer or as additional layers, for example, metal layers, connected electrically conductively to these layers.

According to at least one embodiment of the optoelectronic semiconductor device, a radiation exit surface of the semiconductor device runs parallel to the active region, thus parallel to a main extension plane of the active region. In particular, the optoelectronic semiconductor device has precisely one radiation exit surface. For example, the radiation exit surface is formed level. "Level" in this context means in particular that the radiation exit surface is free of kinks. However, the level radiation exit surface can be provided with patterning, for example, roughening, to increase the outcoupling efficiency.

According to at least one embodiment of the semiconductor device, the semiconductor device has a plurality of side faces, which run obliquely or perpendicular to the radiation exit surface. For example, the side faces run perpendicular or substantially perpendicular to the radiation exit surface. Substantially perpendicular is understood to mean a deviation of at most 10° from the perpendicular orientation.

According to at least one embodiment of the semiconductor device, the semiconductor device has a contact track, which connects the semiconductor chip electrically conductively to a contact surface for the external electrical contacting of the semiconductor device. The contact track runs in particular in places on one of the side faces. The electrical contacting by means of the contact track is in particular a wireless contacting of the semiconductor chip.

According to at least one embodiment of the semiconductor device, one of the side faces is provided as a mounting side face for fastening the semiconductor device. In a mounting of the optoelectronic semiconductor device on a connection carrier, for instance a circuit board, in such a way that the mounting side face is facing the connection carrier, an external electrical contacting of the contact surface can take place with the connection carrier. The contact surface is arranged in particular on a side face adjoining the mounting side face. A fastening means, for example, a solder, can cover this side face in places when fastening the semiconductor device on the connection carrier and thus create an electrical contact with the contact surface. The mounting side face itself can be free of an electrically conductive contact coating. For example, at least two side faces formed by the molding are free of an electrically conductive contact coating.

The semiconductor device is executed in particular as a surface mounted device (SMD), which is formed as a laterally emitting device (also termed "Sidelooker"). A main radiation direction of the semiconductor device running perpendicular to the radiation exit surface thus runs parallel or substantially parallel to the mounting side face and thus parallel or substantially parallel to a main extension plane of the connection carrier.

According to at least one embodiment of the semiconductor device, the semiconductor device has a molding, which is formed onto the semiconductor chip in places. In particular, the molding forms the mounting side face at least in regions. For example, the molding forms all side faces of the semiconductor device, at least in regions. In case of doubt, the side faces are understood as those external faces of the semiconductor device that border the semiconductor device in a lateral direction and run obliquely or perpendicular to the radiation exit surface. A direction that runs in the main extension plane of the active region is regarded as a lateral direction. In other words, the side faces and in particular the mounting side face run between a rear side remote from the radiation exit surface and a front side of the molding lying opposite the rear side.

At the places at which the molding is formed onto the semiconductor chip, the molding in particular directly adjoins the semiconductor chip. In particular, the molding adjoins at least two side faces of the semiconductor chip, for example, two opposing side faces. The radiation exit surface of the semiconductor device is expediently free of the molding. The molding is formed in particular opaque for the radiation generated in the active region. However, the molding can also be formed transparent or at least translucent for the radiation. For example, the molding contains additives such as white pigments or carbon black for an increase or targeted reduction in the reflectivity. The molding can be formed in particular in one piece. Thus no interfaces exist within the molding. Alternatively it is conceivable for the molding to be formed in several layers, wherein the layers can contain materials different from one another.

According to at least one embodiment of the semiconductor device, a rear side of the semiconductor chip remote from the radiation exit surface is free of material of the molding. The rear side of the semiconductor chip is thus not covered by the molding in any place.

In at least one embodiment of the optoelectronic semiconductor device, the semiconductor device has a semiconductor chip, which has a semiconductor layer sequence with an active region provided for generating radiation. The semiconductor device also has a radiation exit surface, which runs parallel to the active region. The semiconductor device further comprises a plurality of side faces, which run obliquely or perpendicular to the radiation exit surface, and a molding, which is formed onto the semiconductor chip in places. One of the side faces is provided as a mounting side face for fastening the semiconductor device. A contact track, which connects the semiconductor chip electrically conductively to a contact surface for the external electrical contacting of the semiconductor device, runs in places on one of the side faces. A rear side of the semiconductor chip remote from the radiation exit surface is free of material of the molding.

The mounting side face and the side face on which the contact track runs and which in particular forms the contact surface, can be in particular side faces different from one another that run, for example, obliquely or perpendicular to one another and adjoin one another. The mounting side face itself can be free at least in places or completely free of contact material. This means that no contact material is arranged on the molding on the mounting side face in a direction running perpendicular to the mounting side face.

According to at least one embodiment of the semiconductor device, an extension of the semiconductor chip and of the molding perpendicular to the radiation exit surface differ from one another by at most 20 µm. In other words, the semiconductor chip has substantially the same thickness as the molding. It has been shown that the production of the semiconductor devices is simplified by this, in particular in comparison with methods in which the semiconductor chips are significantly, for example, by at least 50 µm, thinner than the moldings. In contrast to the normal endeavor to reduce the thickness of the semiconductor chips for miniaturization of the semiconductor devices, the semiconductor chips have a comparatively large thickness, for example, a thickness of at least 150 µm.

According to at least one embodiment of the semiconductor device, the thickness of the semiconductor chip, thus the extension of the semiconductor chip perpendicular to the radiation exit surface, is greater than the extension of the molding along this direction. In conventional devices, in particular in the case of devices radiating in a lateral direction, the extension of the moldings along this direction is significantly greater, on the other hand, than the extension of the semiconductor chip.

According to at least one embodiment of the semiconductor device, the semiconductor chip projects on the rear side and/or on the front side by at least 0.5 µm and at most 10 µm beyond the molding. The production of the semiconductor devices is simplified by this. In principle, however, it is also conceivable that the semiconductor chip and the molding end flush with one another on the rear side and/or on the front side.

According to at least one embodiment of the semiconductor device, the molding adjoins the semiconductor chip at least at two side faces, in particular at least at two opposing side faces of the semiconductor chip. Furthermore, the molding can also encapsulate all side faces of the semiconductor chip, at least in places. A mechanically stable connection between molding and semiconductor chip is thus simplified.

According to at least one embodiment of the semiconductor device, the semiconductor chip has the first contact and the second contact on a side lying opposite the rear side of the semiconductor chip. The contacts are each connected via a contact track to the contact surface or another contact surface, wherein the contact tracks run in places on a common main face, in particular on a front side, of the molding.

According to at least one embodiment of the semiconductor device, the semiconductor chip has the first contact on the side lying opposite the rear side and the second contact on the rear side. In particular, the contacts are each connected via a contact track to the contact surface or the further contact surface. The semiconductor chip thus has only one contact on the front side. Furthermore, both contacts can also be arranged on the rear side of the semiconductor chip.

According to at least one embodiment of the semiconductor device, the molding is formed reflective for the radiation generated in the semiconductor chip. The reflectivity for a peak wavelength of the radiation generated in the active region is preferably at least 60%, preferably at least 80%. Radiation emitted in the direction of the molding can thus be reflected back into the semiconductor chip and subsequently exit the semiconductor device through the radiation exit surface.

According to at least one embodiment of the semiconductor device, the contact track is led over an interface between the molding and the semiconductor chip, wherein the contact track is spaced apart from the interface in a direction running perpendicular to the radiation exit surface. The interface adjoins the front side of the molding in particular. At the interface between the molding and the semiconductor chip, the contact track is not in direct mechanical contact with the semiconductor chip. The danger of an electrical short circuit is thus avoided.

According to at least one embodiment of the semiconductor device, an electrically insulating material is arranged between the interface and the contact track, for example, a dielectric material. Alternatively, a cavity can also be formed between the interface and the contact track. The cavity is free of solid matter. For example, the cavity is filled with a gas, for example, air.

A method for producing a semiconductor device has, according to at least one embodiment, a step in which a plurality of semiconductor chips are provided, which each have an active region provided for generating radiation and a radiation exit surface. For example, the semiconductor chips are mounted on an auxiliary carrier, for example, in the form of a flexible film with adhesive properties.

According to at least one embodiment of the method, the method comprises a step in which the semiconductor chips are encapsulated in regions by a molding composition to form a molding assembly. The encapsulation can take place by casting, for example, wherein the term casting generally describes methods for applying a molding composition and in particular comprises injection molding, transfer molding and compression molding.

In particular, during forming of the molding assembly, the semiconductor chips on a rear side lying opposite the radiation exit surface remain free of the molding composition.

According to at least one embodiment of the method, the method comprises a step in which an in particular electrically conductive coating is formed on the molding assembly for electrical contacting of the semiconductor chips. The coating is formed patterned for the contacting of the semiconductor chips, thus not over the entire surface. The coating can be formed, for example, by vapor deposition or sputtering. In a later step, the thickness of the electrically conductive coating can be increased, in particular to increase the electrical conductivity, for example, by electrodeposition or electroless deposition.

According to at least one embodiment of the method, the molding assembly has at least one recess between adjacent semiconductor chips respectively and the side faces of the recesses are covered at least in places with the patterned coating. The recesses can extend completely through or only in regions through the molding assembly.

The molding assembly can be formed in such a way that the molding assembly already has the recesses. For example, a suitably formed casting tool can be used. Alternatively, during forming of the molding assembly, a patterned sacrificial layer can be provided at the places at which the recesses are provided. After the formation of the molding assembly, the sacrificial layer can be removed again, so that the side faces of the recesses created are accessible for a coating.

Alternatively to the formation of a molding assembly with recesses, the recesses can be introduced into the molding assembly by material removal following the formation of the molding assembly and before applying the coating, for example, mechanically, for instance by boring, chemically or by coherent radiation. The recesses can be formed circular, elliptical, elongated or groove-shaped, for example. The molding assembly is expediently formed continuously with the recesses. The recesses thus do not split the molding assembly.

According to at least one embodiment of the method, the method comprises a step in which the molding assembly is singulated into a plurality of semiconductor devices, which each have a semiconductor chip and at least one contact surface, wherein on singulation a side face of the singulated moldings that is created forms a mounting side face of the semiconductor device. The singulation takes place in particular only after the application of the coating, so that the side faces of the semiconductor devices created during singulation are free of material for the coating. The singulation can be achieved by a mechanical process, for example, sawing, by a chemical process, for example, etching, or by coherent radiation, for instance by laser cutting.

In at least one embodiment of the method for producing a plurality of semiconductor devices, a plurality of semiconductor chips is provided, which each have an active region provided for generating radiation and a radiation exit surface. The semiconductor chips are encapsulated in regions by a molding composition to form a molding assembly, wherein the semiconductor chips on a side lying opposite the radiation exit surface remain free of the molding composition. A patterned coating is formed on the molding assembly for electrical contacting of the semiconductor chips, wherein the molding assembly has at least one recess between adjacent semiconductor chips respectively and the side faces of the recesses are covered at least in places with the patterned coating. The molding assembly is singulated into a plurality of semiconductor devices, which each have a semiconductor chip and at least one contact surface formed by the coating, wherein a side face of the singulated moldings that is created during singulation forms a mounting side face of the semiconductor device respectively.

According to at least one embodiment of the method, the semiconductor chips are arranged during encapsulation between two films, which adjoin the semiconductor chips. The distance between the films corresponds substantially to the thickness of the molding assembly formed during encapsulation. In particular, the semiconductor chips can be pressed into an adhesive layer of the film. Due to this the semiconductor chips can project on one side or on both sides from the molding assembly thus formed.

Depending on the nature of the encapsulation process, however, the semiconductor chips can also end on at least one side or on both sides flush with the molding assembly.

According to at least one embodiment of the method, the singulation of the molding assembly takes place through the recesses. The side faces of the recesses thus form a part of the external face of the moldings created during singulation.

The method described is especially suitable for producing a semiconductor device described further above. Features named in connection with the semiconductor device can therefore be used also for the method and vice versa.

In the method described, the mounting side face and also the side face of the semiconductor device lying opposite the mounting side face are preferably created in the singulation step. The side faces running obliquely or perpendicular to these side faces can be formed, depending on the dimensioning of the recesses, completely or at least partly by the side faces of the recesses.

The component height, thus the extension vertical to the mounting side face, is thus determined by the spacing of parallel separating lines in the singulation step and can therefore assume even especially low values. In particular, the component height can be smaller than 500 µm. The component height is preferably between inclusively 100 µm and inclusively 400 µm, especially preferably between inclusively 150 µm and inclusively 300 µm, for example, between inclusively 200 µm and inclusively 250 µm. A particularly compact semiconductor device can be provided by this, which makes available an adequate light current during operation.

The formation of the moldings can take place on a large scale for a plurality of devices in a common singulation step. In this case the individual moldings in particular are only created after the side faces of the semiconductor chips are already encapsulated by the material of the molding. Thus the semiconductor chips do not have to be placed in prefabricated housings and electrically contacted. The molding forming the housing is rather only formed by the singulation of the molding assembly with the semiconductor chips embedded therein.

Furthermore, the semiconductor chips on the rear side are free of material of the molding and thus freely accessible, for example, for electrical and/or thermal contacting, for example, by a contact track running in places on the outer face of the molding. In particular, after the formation of the moldings, no step is required to expose the rear side of the semiconductor chips for electrical contacting.

BRIEF DESCRIPTION OF THE DRAWINGS

Other configurations and utilities result from the following description of the exemplary embodiments in connection with the figures.

FIGS. 2C and 2D show exemplary embodiments of a semiconductor chip in a schematic sectional view;

Identical and similar elements or elements having the same effect are provided with the same reference signs in the figures.

The figures are schematic representations in each case and therefore not necessarily true to scale. On the contrary, comparatively small elements and in particular layer thicknesses can be shown exaggeratedly large for the clarification purposes.

DETAILED DESCRIPTION OF ILLUSTRATIVE EMBODIMENTS

Figure 1A:
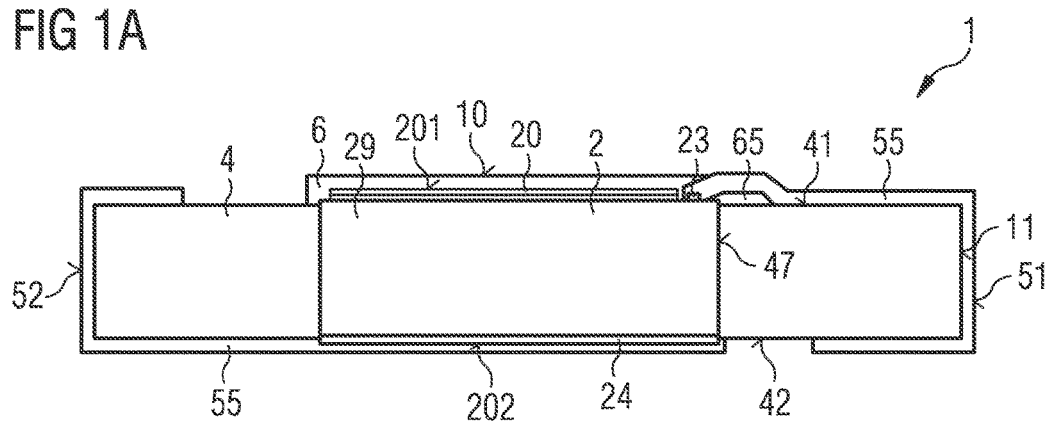
FIGS. 1A and 1B show an exemplary embodiment of an optoelectronic semiconductor device in a top view of the radiation exit surface (FIG. 1B) and associated sectional view along the line AA' (FIG. 1A)
Figure 1B:
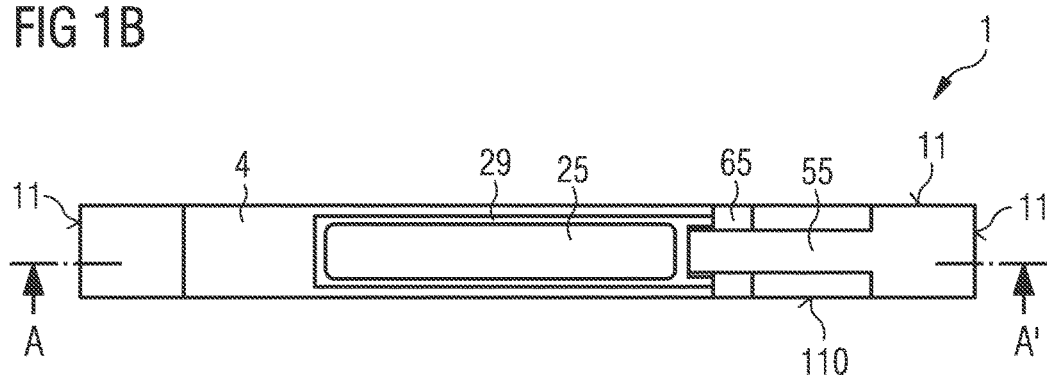

A first exemplary embodiment of a semiconductor device 1 is shown schematically in FIGS. 1A and 1B.

The semiconductor device 1 has a semiconductor chip 2 provided for generating radiation with a semiconductor layer sequence 25. The semiconductor layer sequence has an active region 20 provided for generating radiation. A radiation exit surface 10 of the semiconductor device runs parallel to the main extension plane of the active region. Details of the semiconductor chip 2 are explained in greater detail with reference to two exemplary embodiments in connection with FIGS. 1C and 1D.

Molded onto the semiconductor chip 2 is a molding 4. The molding 4 is used for the mechanical stabilization of the semiconductor chip and forms a housing for the semiconductor chip. The molding extends perpendicular to the radiation exit surface 10 between a rear side 42 of the molding lying opposite the radiation exit surface and a front side 41 of the molding. At the places at which the molding is molded onto the semiconductor chip 2, the molding directly adjoins the semiconductor chip.

Side faces 11 of the semiconductor device 1 run between the rear side 42 and the front side 41. The molding forms these side faces at least in places. The side faces 11 run obliquely or perpendicular to the radiation exit surface 10. One of the side faces is formed as a mounting side face 110.

The molding can contain a polymer material or be formed of such a material. For example, the polymer material can contain an epoxy, a silicone, PPA or polyester. The polymer material can be filled with in particular inorganic particles. The particles can contain, for example, glass, $TiO_2$, $Al_2O_3$ or ZrO or consist of such a material.

Arranged on a front side 201 of the semiconductor chip 2 is a radiation conversion element 6. The radiation conversion element forms the radiation exit surface 10 of the semiconductor device 1. The radiation conversion element is provided to convert primary radiation generated in the semiconductor chip 2, in particular in the active region 20, at least partially into secondary radiation, so that the semiconductor device as a whole emits a mixed radiation, for example, for instance mixed light that appears white to the human eye. However, such a radiation conversion element can also be dispensed with. In this case the semiconductor chip 2 can itself form the radiation exit surface.

The semiconductor chip 2 in the exemplary embodiment shown has a first contact 23 on the front side and a second contact 24 on the rear side. The first contact and the second contact are each connected electrically conductively via contact tracks 55 to a contact surface 51 and to another contact surface 52. The contact surfaces are arranged on side faces 11 of the semiconductor device, for example, on two opposing side faces, which each adjoin the mounting side face 110 and run obliquely or perpendicular to the mounting side face.

The mounting side face 110 of the molding 4 is free of electrically conductive contact material.

The semiconductor chip 2 extends in a vertical direction running perpendicular to a main extension plane of the active region 20 between a front side 201 and a rear side 202. The rear side remote from the radiation exit surface 10 is completely free of material of the molding.

An extension of the semiconductor chip 2 and an extension of the molding 4 in a direction running perpendicular to the radiation exit surface 10 differ by a maximum of 20 µm from one another. The semiconductor chip thus has substantially the same thickness as the molding. In particular, the extension of the semiconductor chip perpendicular to the radiation exit surface is greater than the extension of the molding. In the exemplary embodiment shown the semiconductor chip projects on the rear side and on the front side beyond the molding, for example, by at least 0.5 µm and at most 10 µm.

It has been shown that a semiconductor device of this kind can be produced in a simplified manner. Alternatively it is conceivable that the semiconductor chip projects only on one side, for example, only on the front side or only on the rear side, beyond the molding. It is further conceivable that the semiconductor chip does not project beyond the molding on any side.

The contact track 55 is led over an interface 47 between the molding 4 and the semiconductor chip 2. At this place the contact track is spaced apart from the interface 47 in a direction running perpendicular to the radiation exit surface 10. The risk of an electrical short circuit of the semiconductor chip 2 by the contact track 55 is thus avoided. In the exemplary embodiment shown, an electrically insulating material 65 is arranged between the contact track 55 and the interface 47. Deviating from this, a cavity can also be formed between the contact track and the interface.

Figure 1C:
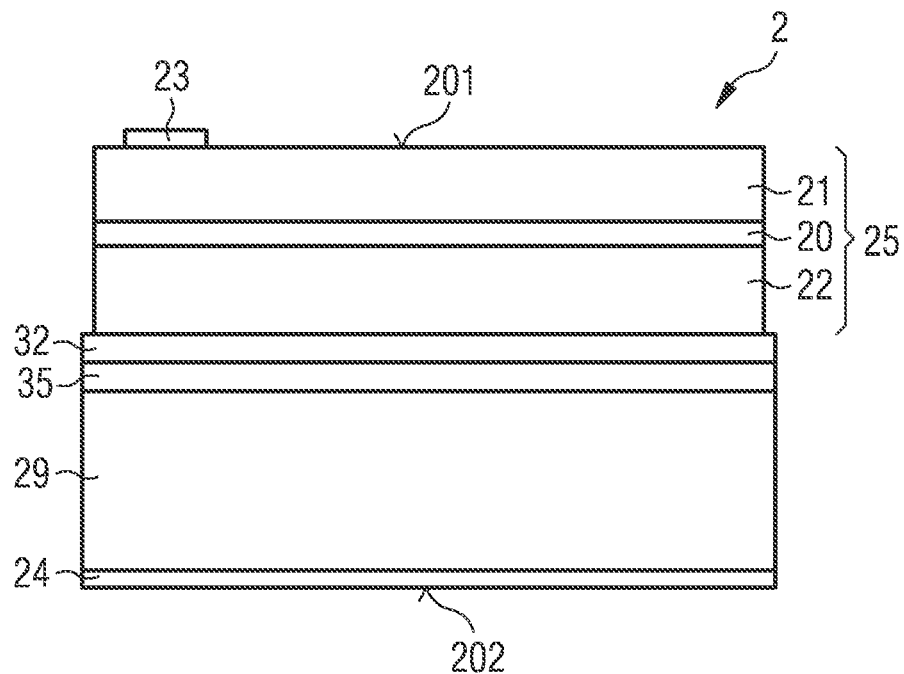
FIGS. 1C and 1D show exemplary embodiments of a semiconductor chip in a schematic sectional view.
Figure 1D:
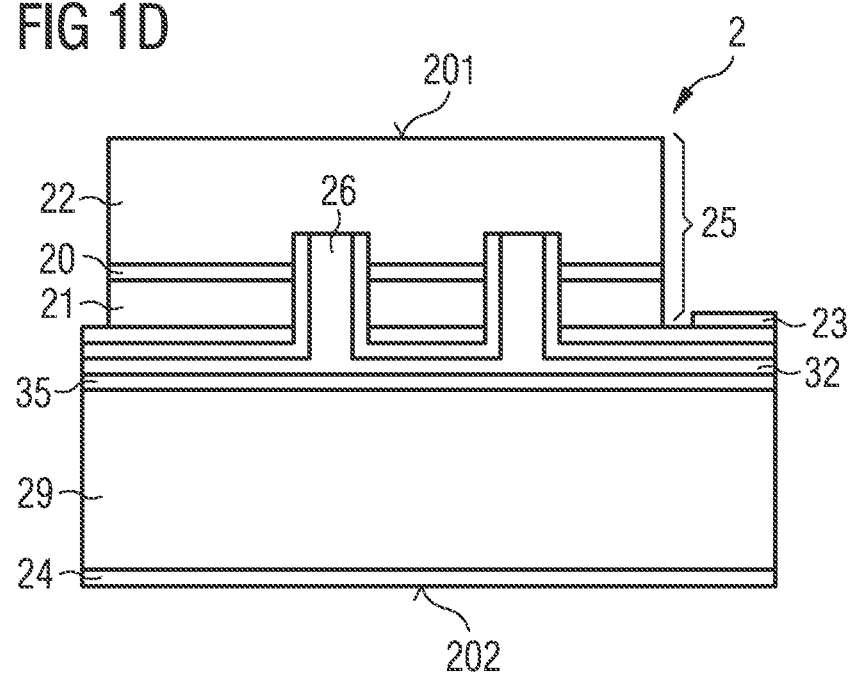

In FIGS. 1C and 1D two exemplary embodiments are shown of semiconductor chips with a front-side contact and a rear-side contact.

The semiconductor chips 2 each have a semiconductor layer sequence 25 with an active region 20, which is arranged between a first semiconductor layer 21 of a first conductor type and a second semiconductor layer 22 of a second conductor type different from the first conductor type. The first contact 23 is connected electrically conductively to the first semiconductor layer 21. The second contact 24 is connected electrically to the second semiconductor layer 22. The semiconductor layer sequence 25 is arranged respectively on a carrier 29. The carrier is distinct from a growth substrate for the semiconductor layer sequence and is used for mechanical stabilization of the semiconductor layer sequence. The growth substrate is removed. Such semiconductor chips are also described as thin film semiconductor chips.

The semiconductor layer sequence 25 is connected via a bonding layer 35 to the carrier in a mechanically stable and electrically conductive manner. In the semiconductor chip shown in FIG. 1C, the electrical contacting of the semiconductor layer arranged on the side of the active region 20 remote from the carrier 29 takes place via the first contact 23 arranged on this semiconductor layer.

In contrast to this, the electrical contacting in FIG. 1D takes place via recesses 26, which extend from the carrier 29 through the active region 20. In the recesses 26, the second semiconductor layer 22 is connected electrically conductively to a connection layer 32. The first contact 23 is arranged to the side of the semiconductor layer sequence 25. The front side 201 of the semiconductor chip 2 is free of electrical contact material.

A thin film semiconductor chip 2 represents a surface emitter in a good approximation, so that nearly the entire radiation generated in the active region 20 exits through the radiation exit surface 10. The molding 4 can therefore also be formed opaque, in particular absorbent, for the radiation generated in the active region. To further increase the emitted radiation output, the molding 4 can be formed reflective for the radiation. For example, the material of the molding can include particles increasing the reflectivity, for example, white pigments, such as titanium oxide. Alternatively, coating of the semiconductor chips with a reflective material can be used.

In production of the semiconductor device 1, at least one of the side faces, in particular the mounting side face 110, is created during the singulation of an assembly into the semiconductor devices. The side faces can therefore have singulation traces at least in places, for example, sawing traces or traces of a laser cutting process.

Figure 2A:
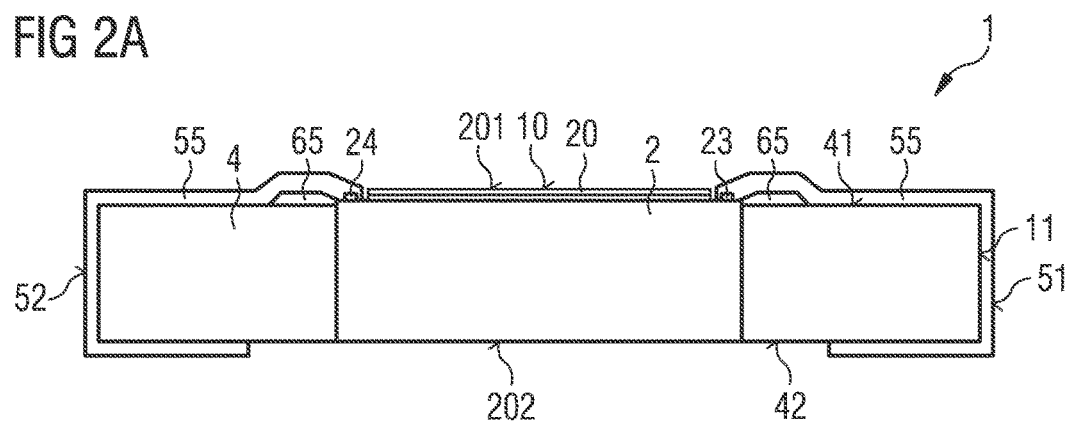
FIGS. 2A and 2B show another exemplary embodiment of an optoelectronic semiconductor device in a top view of the radiation exit surface (FIG. 2B) and associated sectional view along the line BB' (FIG. 2A)
Figure 2B:
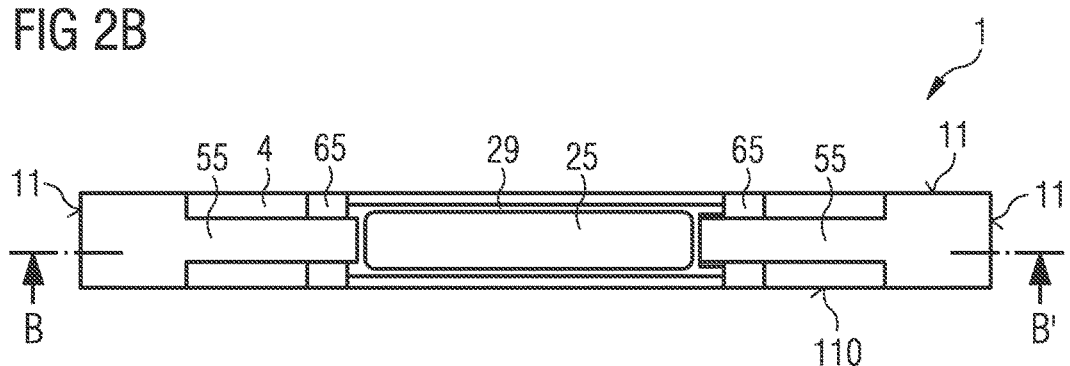

The second exemplary embodiment shown in FIGS. 2A and 2B substantially corresponds to the first exemplary embodiment described in connection with FIGS. 1A and 1B. In contrast to this, the semiconductor chip has two contacts on the front side. The rear side 202 of the semiconductor chip is free of electrically conductive material.

Suitable semiconductor chips are shown in FIGS. 2C and 2D. The semiconductor chip shown in FIG. 2C substantially corresponds to the semiconductor chip shown in FIG. 1D. In contrast to this, the first contact 23 and the second contact 24 are arranged on the side of the carrier 29 facing the semiconductor layer sequence 25. Both contacts are arranged to the side of the semiconductor layer sequence.

The semiconductor chip shown in FIG. 2D is not formed as a thin film semiconductor chip, but as a semiconductor chip in which the carrier 29 is formed by the growth substrate. For example, in the case of a semiconductor layer sequence based on III-nitride compound semiconductor material, sapphire or silicon carbide is suitable as a growth substrate.

Figure 3:
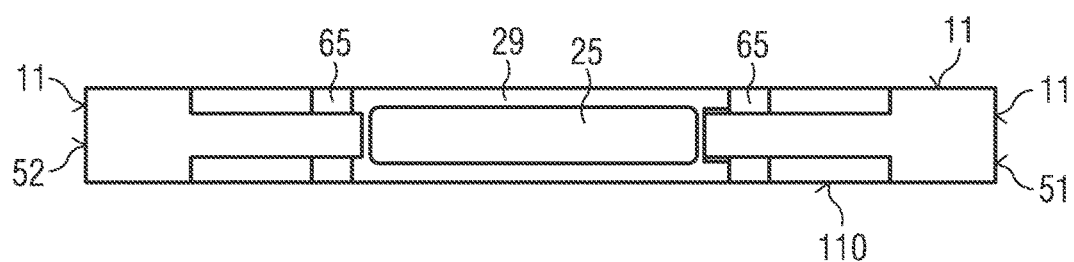
FIG. 3 shows another exemplary embodiment of an optoelectronic semiconductor device in a top view.

The exemplary embodiment shown in FIG. 3 substantially corresponds to the exemplary embodiment described in connection with FIG. 2B. In contrast to this, the semiconductor chip 2, in particular the carrier 29 of the semiconductor chip, forms in places the mounting side face 110 and the opposing side face 11. The molding 4 and the semiconductor chip 2 form the side face of the semiconductor device respectively in regions. In particular, the semiconductor chip and the molding end flush with one another at these side faces. Naturally a semiconductor chip that, as described in connection with FIGS. 1A and 1B, has only a contact on the front side can also form one of the side faces in places.

Figure 4:
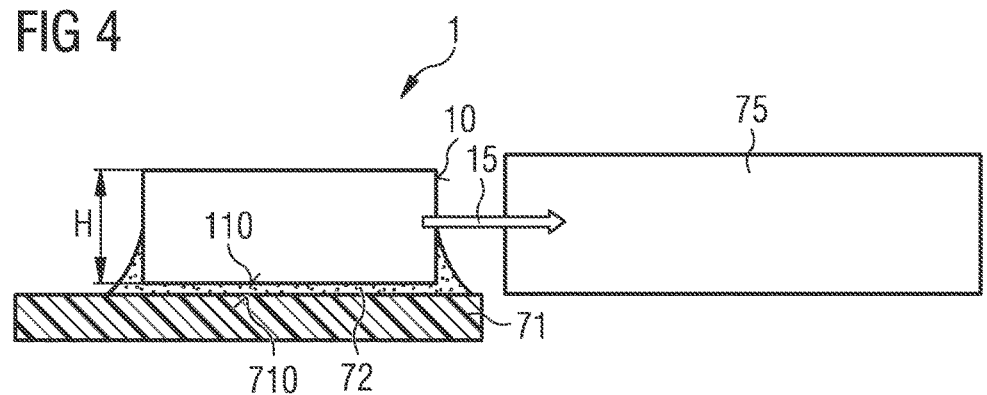
FIG. 4 shows another exemplary embodiment of a device with an optoelectronic semiconductor device in a sectional view.

An apparatus with a semiconductor device 1 described above is shown in FIG. 4 in a schematic side view. The laterally emitting and surface mounted device 1 is arranged on a connection carrier 71, for example, a printed circuit board, such as an FR4 circuit board, wherein the mounting side face 110 faces the connection carrier 71. Radiation emerging perpendicularly through the radiation exit surface 10 runs parallel to a main face 710 of the connection carrier 71. The contact surface 51 and the further contact surface 52 (not seen in FIG. 4) are each connected electrically conductively by a fastening means 72, for example, a solder, to connection carrier faces of the connection carrier.

The semiconductor device 1 described is especially suitable for the lateral coupling of radiation 15 into a light guide 75. On a side lying opposite the light guide, the semiconductor chip 2 is free of the molding 4. The apparatus can be formed in particular as a backlighting module of a liquid crystal display (not shown explicitly). The construction height H perpendicular to the connection carrier can be particularly low, so that even a coupling into thin light guides can take place efficiently. For example, the construction height is between inclusively 100 µm and inclusively 400 µm. In the production of the semiconductor devices 1, the construction height is determined by the distance between adjacent singulation lines.

With reference to FIGS. 5A to 5F, an exemplary embodiment of a production method is described in which semiconductor devices are produced by way of example, which are formed as described in connection with FIGS. 1A and 1B.

Figure 5A:
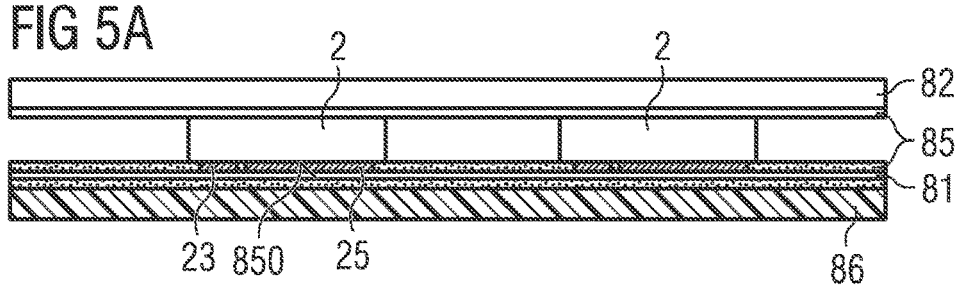
FIGS. 5A to 5F show an exemplary embodiment of a method for producing a semiconductor device with reference to intermediate steps shown schematically in sectional view.

A plurality of semiconductor chips 2 is provided on a common carrier. For example, the semiconductor chips are arranged on a film 81. The film 81 is arranged on a rigid carrier 86, for example. The semiconductor chips 2 are arranged spaced apart from one another, for example, in a matrix arrangement. The semiconductor chips 2, e.g., with the semiconductor layer sequences 25 and the first contacts 23, project into an adhesive layer 85 of the film 81, the adhesive layer 85 having a surface 850. On the side of the semiconductor chips 2 remote from the film 81, another film 82 is applied to the semiconductor chips 2. The further film 82 likewise has an adhesive layer 85 (FIG. 5A).

The semiconductor chips have preferably a thickness between inclusively 150 µm and inclusively 800 µm, especially preferably between inclusively 150 µm and inclusively 500 µm.

Figure 5B:
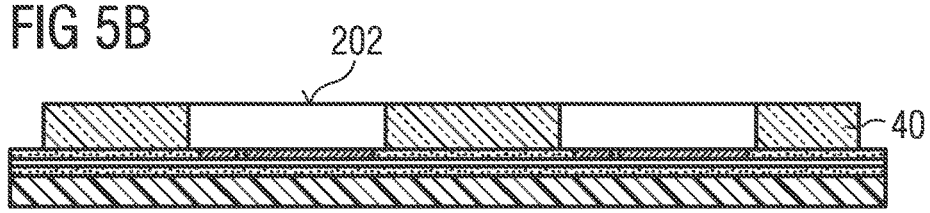

The semiconductor chips are then encapsulated by means of a casting process by a molding composition, so that a molding assembly 40 is created between the films (FIG. 5B). In the molding assembly 40 the semiconductor chips are connected to one another mechanically stably. It is ensured by the further film 82 that the rear sides 202 of the semiconductor chips 2 remain free of the molding composition. Later exposure of the rear sides of the semiconductor chips, for example, by laser ablation, is thus not necessary. Even the use of sacrificial layers on the rear side of the semiconductor chip to keep it free of the molding composition is not required. Any existing rear-side contact, in particular metal contact, of the semiconductor chips is thus directly accessible. This simplifies the electrical contacting, in particular compared with a method in which the semiconductor chip 2 is exposed by grinding.

The front sides of the semiconductor chips facing the radiation exit surface 10 of the finished semiconductor devices 1 likewise remain free of the molding composition. A molding assembly 40 is formed by the molding composition, from which assembly the individual moldings of the semiconductor devices emerge in a later singulation step. The molding composition does not have to be radiation-transmissive, therefore.

The parts of the semiconductor chips 2 projecting into the adhesive layers 85 are not encapsulated in the encapsulation step on the side faces. Following singulation, the semiconductor chips thus project on both sides of the molding assembly beyond this.

On account of the comparatively thick semiconductor chips, larger filling channels result between the films in the casting process, for example, in film-assisted transfer molding.

Furthermore, the semiconductor chips can be fixed during formation of the molding assembly 40 on both sides, thus on the front side and the rear side. The semiconductor chips 2 are thus clamped in, so that the risk of the semiconductor chips moving or tilting during the formation of the molding assembly is reduced.

Figure 5C:
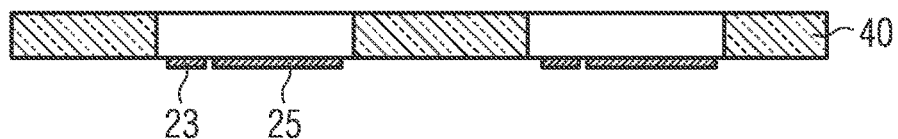
Figure 5D:
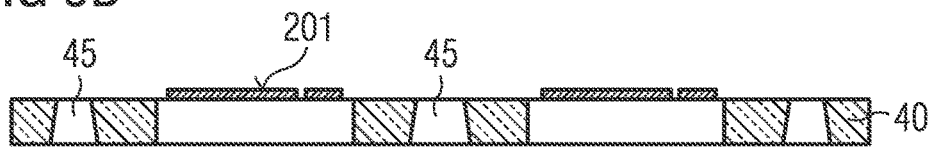

FIG. 5C shows the molding assembly 40 following removal of the film 81 and the further film 82. Then, as shown in FIG. 5D, recesses 45 are formed in the molding assembly, in particular by a removal of material. In the exemplary embodiment shown, the recesses 45 extend in a vertical direction completely through the molding assembly 40. The recesses can be formed, for example, by laser ablation. Alternatively a chemical process or a mechanical process can be used.

Figure 5E:
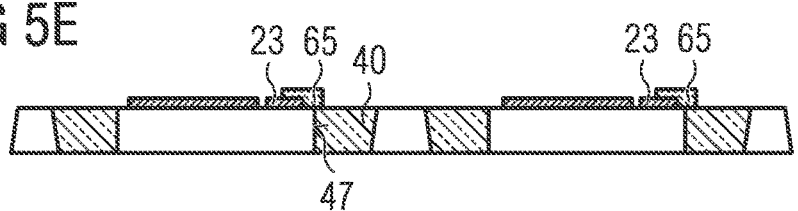

In regions of an interface 47 between the semiconductor chips 2 and the molding assembly 40 in which a contact track is then to be led over the interface, an insulating material 65 is applied. The insulating material 65 covers the interface in a top view of the molding assembly in places (FIG. 5E). This step can also be executed for the formation of the recesses 45.

Figure 5F:
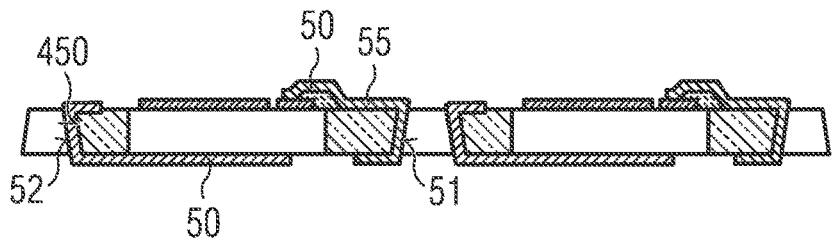

As shown in FIG. 5F, a patterned coating 50 is then formed for the formation of contact tracks 55. The patterned coating contacts the contacts of the semiconductor chips 2 electrically and also covers the side faces 450 of the recesses 45 in places. On these side faces the contact surface 51 connected to the first contact 23 and the further contact surface 52 connected to the second contact 24 (not shown explicitly in FIGS. 5A to 5F for simplified representation) are created.

Alternatively to applying an insulating material, which remains in the semiconductor device 1, a temporary material can also be applied in order to achieve a distance between the interface 47 and the contact track 55. This temporary material can be removed again following the formation of the contact track, so that a cavity exists between the interface and the contact track.

To form the contact tracks 55, a protective lacquer can be applied and patterned, for example. The exposed places of the molding assembly can be covered with a seed layer, for example, by vapor deposition or sputtering. The seed layer can then be reinforced chemically, for example, galvanically, so that the contact tracks have a sufficiently high current-carrying capacity.

The molding assembly 40 is then singulated to form individual semiconductor devices 1, for example, by sawing or laser cutting. This is explained in greater detail in connection with FIGS. 8A and 8B.

At least some of the side faces 11 of the molding 4, in particular the mounting side face 110, are only created on singulation of the molding assembly 40 and thus also after application of the coating. These side faces are therefore free of material of the patterned coating 50.

In FIGS. 6A to 6C and 7A to 7C intermediate steps are shown in each case for a method according to other exemplary embodiments, in which the recesses 45, in contrast to the exemplary embodiment described in connection with FIGS. 5A to 5F, are not produced by a material removal of the molding assembly 40. The molding assembly is rather already formed in such a way that it has the recesses 45. The other production steps can take place as described in connection with FIGS. 5A to 5F.

Figure 6A:
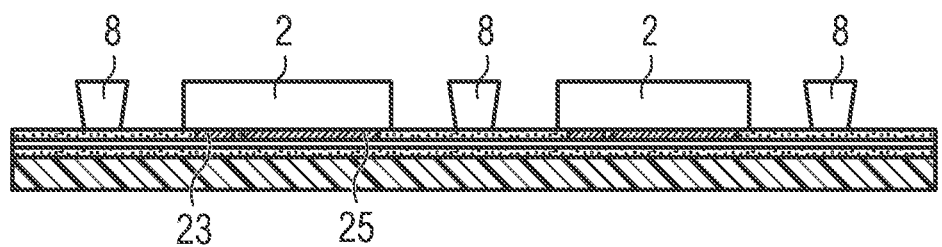
FIGS. 6A to 6C show another exemplary embodiment of intermediate steps of a method for producing a semiconductor device in a schematic sectional view.
Figure 6B:
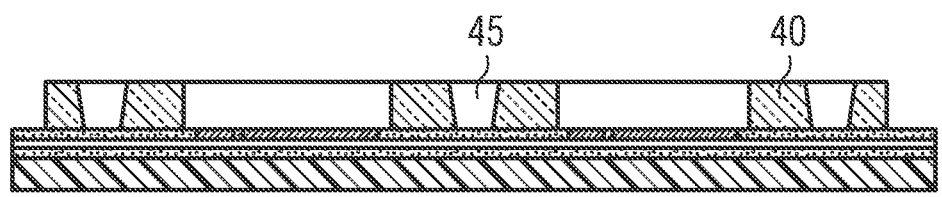
Figure 6C:
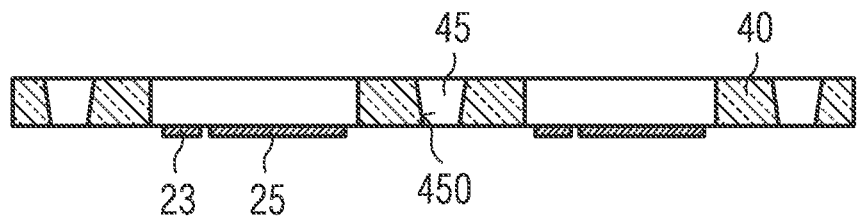

In the exemplary embodiment shown in FIGS. 6A to 6C, a sacrificial layer 8 is applied at the places at which the recesses 45 are to be formed (FIG. 6A). During the formation of the molding assembly 40, not only the semiconductor chips 2 but also the sacrificial layer 8 is encapsulated in regions by the molding composition (FIG. 6B). For example, a photoresist is suitable as a sacrificial layer. Following encapsulation, the sacrificial layer 8 can be removed, so that the side faces 450 of the recesses 45 are accessible for a coating.

Figure 7A:
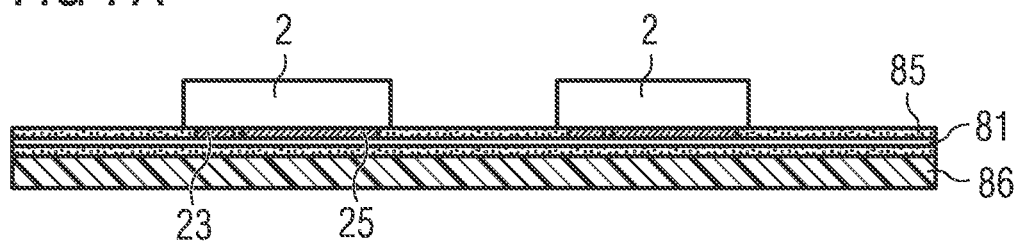
FIGS. 7A to 7C show another exemplary embodiment of intermediate steps of a method for producing a semiconductor device in a schematic sectional view.
Figure 7B:
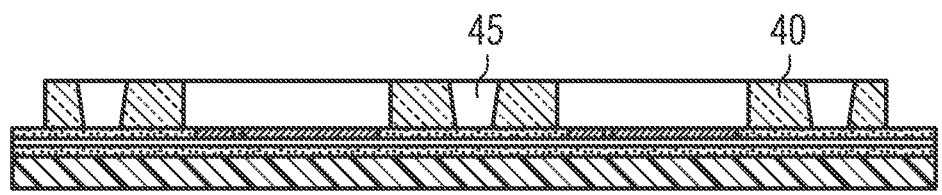
Figure 7C:
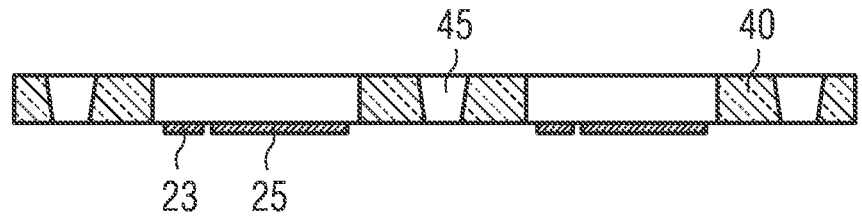

In the exemplary embodiment shown in FIGS. 7A to 7C, the recesses 45 are formed by means of a suitably shaped casting mold for the casting process.

Figure 8A:
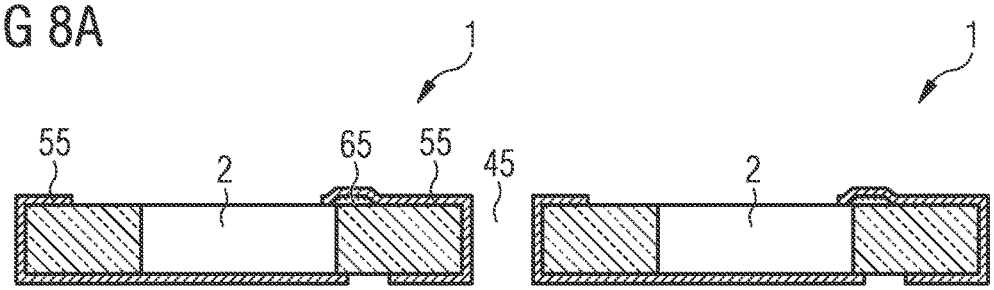
FIGS. 8A and 8B show an exemplary embodiment of a method for producing a semiconductor device with reference to an intermediate step in a top view (FIG. 8B) and in a sectional view (FIG. 8A) along the line CC'.
Figure 8B:
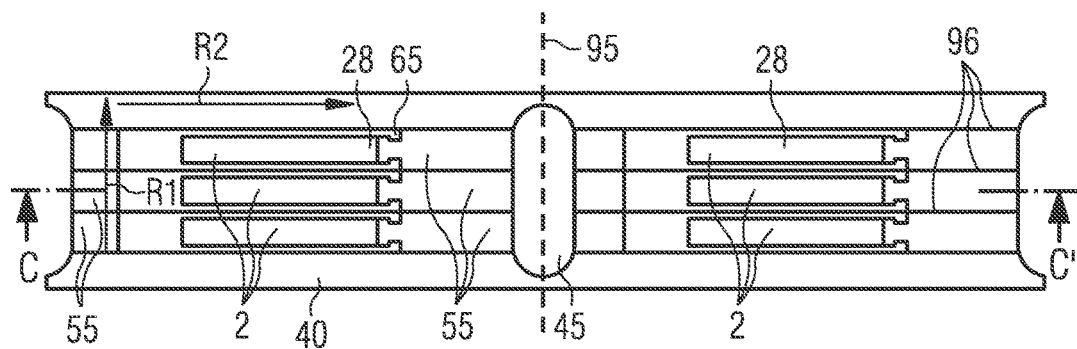

In FIGS. 8A and 8B a singulation step for another exemplary embodiment is shown in a schematic top view (FIG. 8B) and in an associated sectional view. The semiconductor devices created are formed as described in connection with FIG. 3.

Here a plurality of semiconductor chip assemblies 28 is provided, wherein in FIG. 8B a semiconductor chip assembly with, for example, three connected, not yet singulated semiconductor chips is shown. The semiconductor layer sequences 25 of the semiconductor chips are already separated from one another by trench-shaped recesses. The trench-shaped recesses form a mesa trench in each case. However, the semiconductor layer sequences are still located on a continuous carrier 29. A plurality of such semiconductor chip assemblies 3 is placed spaced apart next to each other, for example, in a matrix shape. In FIG. 8B only one region with two semiconductor chip assemblies 28 is shown for a simplified illustration. The placing of such semiconductor chip assemblies is simplified compared with a placing of already singulated semiconductor chips.

As shown in FIG. 8B, recesses 45 are formed in the molding assembly 40 between semiconductor chips 2 of adjacent semiconductor chip assemblies 28 respectively. The recesses can extend completely through the molding assembly as shown in FIG. 8A. Deviating from this, however, it is also conceivable to form the recesses 45 as blind holes.

In the exemplary embodiment shown, the recess 45 is formed as an elongated hole, which extends along its longitudinal direction over more than one semiconductor chip, for example, over the entire semiconductor chip assembly 28. Alternatively the recess 45 can extend along the first direction also over several semiconductor chip assemblies 28, for example, in a groove shape. The recesses 45 are expediently formed so that the molding assembly 40 is still contiguous with the recesses 45.

The singulation of the molding assembly 40 takes place along first singulation lines 95 along a first direction R1 and perpendicular to this along second singulation lines 96 along a second direction R2 running in particular perpendicular to the first direction. The singulation lines 95 run in this case through the recesses 45. The side faces 450 of the recesses 45 form the side faces 11 of the moldings 4 created from the molding assembly 40 by singulation.

In the exemplary embodiment shown, these side faces 11 are thus not created during singulation of the molding assembly 40. Deviating from this, the extension of the recesses 45 can also be smaller than the distance between the second singulation lines 96. In this case the side faces in the region between the recesses 45 are created only during singulation.

In singulation along the second direction R2, the second singulation lines 96 run between the semiconductor chips 2 and cut through the semiconductor chip assembly 28. The final singulation of the semiconductor chips thus takes place only on singulation of the molding assembly 40. In this singulation step, both the material of the molding assembly and of the carriers 29 of the semiconductor chip assembly in particular is cut through. By the singulation along the second singulation lines 96, side faces 11 are created, in particular the mounting side face 110, on which the semiconductor chips 2 and the moldings 40 end flush.

The singulation of the molding assembly 40 can take place largely by analogy for the case of the exemplary embodiments above. In contrast to this, the semiconductor chips 2 are already separated from one another prior to the singulation, so that the second singulation lines 96 run between already singulated semiconductor chips 2. In this case the side faces thus created of the singulated semiconductor device 1 can be formed completely by the respective molding 4.

Using the method described, semiconductor devices, in particular semiconductor devices radiating in a lateral direction, can be produced in a simple and inexpensive manner, are distinguished by a particularly low construction height and at the same time permit optimal coupling even into thin light guides.

The invention is not limited by the description with reference to the exemplary embodiments. On the contrary, the invention comprises every new feature and every combination of features, which includes in particular every combination of features in the claims, even if this feature or this combination is not itself explicitly specified in the claims or exemplary embodiments.

The invention claimed is:

1. An optoelectronic semiconductor device comprising:
a semiconductor chip comprising an active region configured to generate radiation;
a radiation exit surface arranged parallel to the active region;
a plurality of side faces arranged obliquely or perpendicular to the radiation exit surface;
a contact track electrically connecting the semiconductor chip to a contact surface configured to externally electrically contact the semiconductor device;
a molding partially molded to the semiconductor chip;
a rear side of the semiconductor chip remote from the radiation exit surface, the rear side being free of a material of the molding; and
a front side of the semiconductor chip remote from the rear side, the front side being free of the material of the molding,
wherein one of the side faces is configured as a mounting side face for fastening of the semiconductor device, and
wherein the contact track partially runs on one of the side faces.

2. The semiconductor device according to claim 1, wherein an extension of the semiconductor chip and an extension of the molding being perpendicular to the radiation exit surface differ from one another by a maximum of 20 μM.

3. The semiconductor device according to claim 2, wherein the extension of the semiconductor chip perpendicular to the radiation exit surface is greater than the extension of the molding.

4. The semiconductor device according to claim 1, wherein the semiconductor chip projects on a rear side of the molding and/or on a front side of the molding by at least 0.5 μm and at most 10 μm beyond the molding.

5. The semiconductor device according to claim 1, wherein a side face, on which the contact track runs, and the mounting side face adjoin one another and run obliquely or perpendicular to one another.

6. The semiconductor device according to claim 1, wherein the molding adjoins at least two side faces of the semiconductor chip.

7. The semiconductor device according to claim 1, wherein the semiconductor chip has on a side lying opposite the rear side a first contact and a second contact, wherein the first contact is connected via the contact track to the contact surface, wherein the second contact is connected via a second contact track to a second contact surface, and wherein the first contact track and the second contact track run on a common main face of the molding.

8. The semiconductor device according to claim 1, wherein the semiconductor chip has a first contact on a side lying opposite the rear side and a second contact on the rear side, wherein the first contact is connected via the contact track to the contact surface, and wherein the second contact is connected via a second contact track to a second contact surface.

9. The semiconductor device according to claim 1, wherein the molding is a reflective molding for the radiation generated in the semiconductor chip.

10. The semiconductor device according to claim 1, wherein the contact track is led over an interface between the molding and the semiconductor chip and the contact track is spaced apart from the interface in a direction running perpendicular to the radiation exit surface.

11. The semiconductor device according to claim 10, wherein an electrically insulating material is arranged between the interface and the contact track.

12. An optoelectronic semiconductor device comprising:
a semiconductor chip comprising an active region configured to generate radiation;
a radiation exit surface arranged parallel to the active region;

a plurality of side faces arranged obliquely or perpendicular to the radiation exit surface;
a contact track connecting the semiconductor chip to a contact surface configured to electrically conductively contact the semiconductor device;
a molding partially molded to the semiconductor chip;
a rear side of the semiconductor chip remote from the radiation exit surface, the rear side being free of a material of the molding; and
a front side of the semiconductor chip remote from the rear side, the front side being free of the material of the molding,
wherein the molding is opaque for the radiation generated in the active region,
wherein one of the side faces is configured as a mounting side face for fastening of the semiconductor device, and
wherein the contact track partially runs on one of the side faces.

13. The semiconductor device according to claim 1, wherein the semiconductor chip directly adjoins the molding.

14. The semiconductor device according to claim 1, wherein the molding is partially molded to the semiconductor chip so that the molding adjoins outer surfaces of the semiconductor chip.

15. The semiconductor device according to claim 14, wherein the semiconductor chip directly adjoins the molding.

16. The semiconductor device according to claim 14, wherein the molding is partially molded to the semiconductor chip so that the molding adjoins outer surfaces of the semiconductor chip.

* * * * *